United States Patent [19]
Hiskes et al.

[11] Patent Number: 5,447,569
[45] Date of Patent: Sep. 5, 1995

[54] MOCVD SYSTEM FOR FORMING SUPERCONDUCTING THIN FILMS

[76] Inventors: Ronald Hiskes, 3484 Waverley, Palo Alto, Calif. 94306; Stephen DiCarolis, 2212 Cabrillo Ave., Santa Clara, Calif. 95050

[21] Appl. No.: 970,660

[22] Filed: Dec. 12, 1990

[51] Int. Cl.$^6$ ............................................. C23C 16/00
[52] U.S. Cl. ................................... 118/726; 505/730; 505/732
[58] Field of Search ................. 118/726; 505/730, 732

[56] References Cited

U.S. PATENT DOCUMENTS

| | | | |
|---|---|---|---|
| 4,854,264 | 8/1989 | Noma | 118/726 |
| 5,204,314 | 4/1993 | Kirlin | 118/726 |

OTHER PUBLICATIONS

W. J. Lackey, et al., "Rapid Vapor Deposition of Superconducting YBa$_2$Cu$_2$Ox", 19 Mar. 1990, Applied Physics Letters 56 (12).

H. Yamane, et al., "Preparation of Superconducting-Oxide Films by CVD and Their Properties", May, 1989, Journal de Physique, Collgue C5.

A. Erbil, K. Zhang, B. S. Kwak and E. P. Boyd, "A Review of Metalorganic Chemical Vapor Deposition of High–Temperature Superconducting Thin Films", School of Physics, Georgia Tech.

*Primary Examiner*—Richard Bueker

[57] ABSTRACT

A system for MOCVD fabrication of superconducting oxide thin films provides a feed tube having a narrow slot along its length with a uniform mixture of powdered precursor materials packed inside the tube. The mixture composition is such that the resulting film has the desired stoichiometry. The tube moves downward at a controlled rate past a bank of heating lamps surrounded by a heat reflector. At each position of the tube this structure heats a localized section of the precursor material, with a sharp temperature gradient at the boundary of the section so that the heating is confined to this section. The precursor material in the heated section is substantially completely vaporized, with negligible decomposition and nonvolatile residue formation, and the vaporization rate is governed by the downward velocity of the tube. The vaporized material escapes through the longitudinal slot, and is swept by a carrier gas into a reaction zone. Oxygen is mixed with the gas stream, and the reaction products are deposited as a thin film on the substrate. A modification of this system includes coils adjacent to the reaction zone, connected to an rf generator. These coils produce a plasma in the reagent gas mixture that enhances the chemical reaction.

29 Claims, 4 Drawing Sheets

MOCVD SYSTEM FOR FORMING SUPERCONDUCTING THIN FILMS

BACKGROUND OF THE INVENTION

This invention is related to techniques for fabricating high temperature superconducting oxide materials, and more particularly, to techniques for making thin films of such materials by metalorganic chemical vapor deposition (MOCVD).

The discovery of superconducting oxide materials with critical temperatures above the boiling point of liquid nitrogen has stimulated much interest in methods for making thin films of these materials. Such films can be extremely useful in electronic devices and energy transport systems, and many researchers have devoted substantial effort to finding a satisfactory method of fabricating these films.

Chemical vapor deposition has been extensively used for preparation of films and coatings in a variety of applications. The advantages of this method include higher quality, faster processing and the ability to coat substrates of irregular shapes. Accordingly workers in the relevant field have been attempting to fabricate superconducting oxide films by chemical vapor deposition in a feasible manner. In particular, much attention has been devoted to the growth of thin films of the celebrated Y-Ba-Cu-O material by MOCVD. Such films were first fabricated in 1988, within the year after the discovery of the superconducting properties of $YBa_2Cu_3O_{7-x}$.

The primary difficulty with this technique arises from the solid precursor reagents that are used as the source materials. Typically these metalorganic precursors are tetramethylheptanedionate (TMHD) powders that are chelates of the Y, Ba, and Cu source metals. These precursors tend to decompose at temperatures close to the vaporization temperatures. This is particularly true of the Ba-TMHD precursor, which decomposes almost as fast as it vaporizes. Thus the quantity and volatility of the sources change continuously and non-reproducibly. Therefore it is important to control precisely the exposure of these precursors to elevated temperatures. Ideally this exposure should be as short as possible; however the chemical vapor deposition method requires that the precursor sources be stabilized at the vaporization temperatures, which means that this exposure may extend over a substantial period of time. Some workers have succeeded in fabricating high quality Y-Ba-Cu-O films, despite these obstacles, but low deposition rates are reported, typically 1 μm/h. In addition, the control of the process is very delicate and repeatability is poor. The commercial feasibility of these previous processes has not been established heretofore.

The standard chemical vapor deposition method employs precursor sources in separate vaporization chambers. The precursors, which may be solid or liquid, are placed into boats or bubblers, and individually heated to a temperature at which they develop appreciable vapor pressures. The vaporized precursor material is transported by passing a carrier gas over the boat or bubbler, and sweeping the vapors through a gas jungle to the reaction chamber where they are mixed and the reaction product is deposited on the heated substrate. This technique works well for liquid precursors, where the carrier gas can be bubbled up through the liquid reservoir to fully saturate it before entering the gas jungle. In this way, the amount of material transported to the reaction chamber is precisely controlled by the temperature of the precursor reservoir (which must be in thermal equilibrium) and by the flow rate of the carrier gas bubbled through the reservoir. Elaborate schemes have been developed to ensure complete saturation, precise temperature control, and accurate gas flow regulation. When this method is used to grow heterostructure films with sharp boundaries between layers, the pressures of the various gas streams must be balanced to avoid composition excursions when the composition is changed.

This standard technique encounters further problems when it is used for solid-state precursors. It is difficult to ensure complete saturation of the carrier gas stream at the elevated temperatures required to raise the solid vapor pressure to appreciable values because the surface area of the solid is changing continuously due to depletion and grain growth effects. This problem may be alleviated by using large excesses of precursor material beyond the amount needed for film growth. This can result in a substantial waste of precursor material.

The use of the conventional MOCVD method for making superconducting oxide films is discussed in the article "Preparation of Superconducting-Oxide Films by CVD and Their Properties" by H. Yamane, H. Kurosawa and T. Hirai, published in Journal de Physique, Colloque C5, Supplement au n° 5, Tome 50, Mai 1989. This paper describes the parameter control required to grow these films and the resulting properties of films made in this way. The problems discussed above are referred to.

The decomposition problem is also addressed in the article "Rapid Chemical Vapor Deposition of Superconducting $YBa_2Cu_3O_x$" by W. J. Lackey, W. B. Carter, J. A. Hanigofsky, D. N. Hill, E. K. Barefield, G. Neumeier, D. F. O'Brien, M. J. Shapiro, J. R. Thompson, A. J. Green, T. S. Moss, III, R. A. Jake, and K. R. Efferson, published in Applied Physics Letters, 56 (12), 19 Mar. 1990, pages 1175-1177. These authors describe a powder feed method for introducing mixtures of powdered reagents into the carrier gas, which itself is a mixture of argon and oxygen. The powder is transported to the reaction zone where it vaporizes, reacts, and deposits $YBa_2Cu_3O_x$ on a hot substrate. This method achieves substantially higher deposition rates and improved film quality control in comparison with the standard separate-source method. The article also reports improvements with respect to the process control problem.

SUMMARY OF THE INVENTION

The present invention comprises an improved apparatus and method for fabricating superconducting oxide thin films with the MOCVD process using a single precursor reagent source. This source is a mixture of metal chelates in powdered form that is packed into a glass tube having a longitudinal slot running the length of the tube. The powder mixture composition is determined by the desired stoichiometric ratios of the deposited film. The tube is longitudinally moved at a controlled rate through a high temperature region defined by a sharp temperature gradient, such that the powder mixture passing into this region vaporizes at a steady state and escapes from the tube through the slot. This vaporization occurs sufficiently rapidly that there is minimal precursor decomposition.

The vaporized precursor mixture is transported by a carrier gas to the substrate where the reaction and deposition takes place. Oxygen is introduced into the mixture at a controlled rate, and the reaction zone is heated to promote the chemical reaction. The reaction may be enhanced further by surrounding the zone with coils driven by an ac generator to produce an rf plasma in the mixture.

The above apparatus and method have been used to grow superconducting oxide films of high quality. This technique does not suffer from the precursor decomposition problem, and offers better process control compared to previous techniques. The film growth rate and composition can be independently controlled.

It is an object of this invention to provide an apparatus and method for fabricating superconducting oxide thin films by the MOCVD process with a single reagent source containing a mixture of precursor materials having a composition that will produce the desired stoichiometry in the resulting films.

A second object of this invention is to provide said apparatus and method in which the decomposition of the precursor reagents prior to arrival in the reaction zone is negligible.

A further object of this invention is to provide an apparatus and method for fabricating superconducting oxide thin films by the MOCVD process in which the film growth rate may be precisely controlled independently of the vaporization temperature, composition, and carrier gas flow rates.

Yet another object of this invention is to provide an apparatus and method for fabricating superconducting oxide thin films by the MOCVD process in which the resulting films have reproducibly high quality.

These and other objects, advantages, characteristics and features of this invention may be better understood by examining the following drawings together with the detailed description of the preferred embodiment.

DETAILED DESCRIPTION OF THE PREFERRED EMBODIMENT

Figure 1:
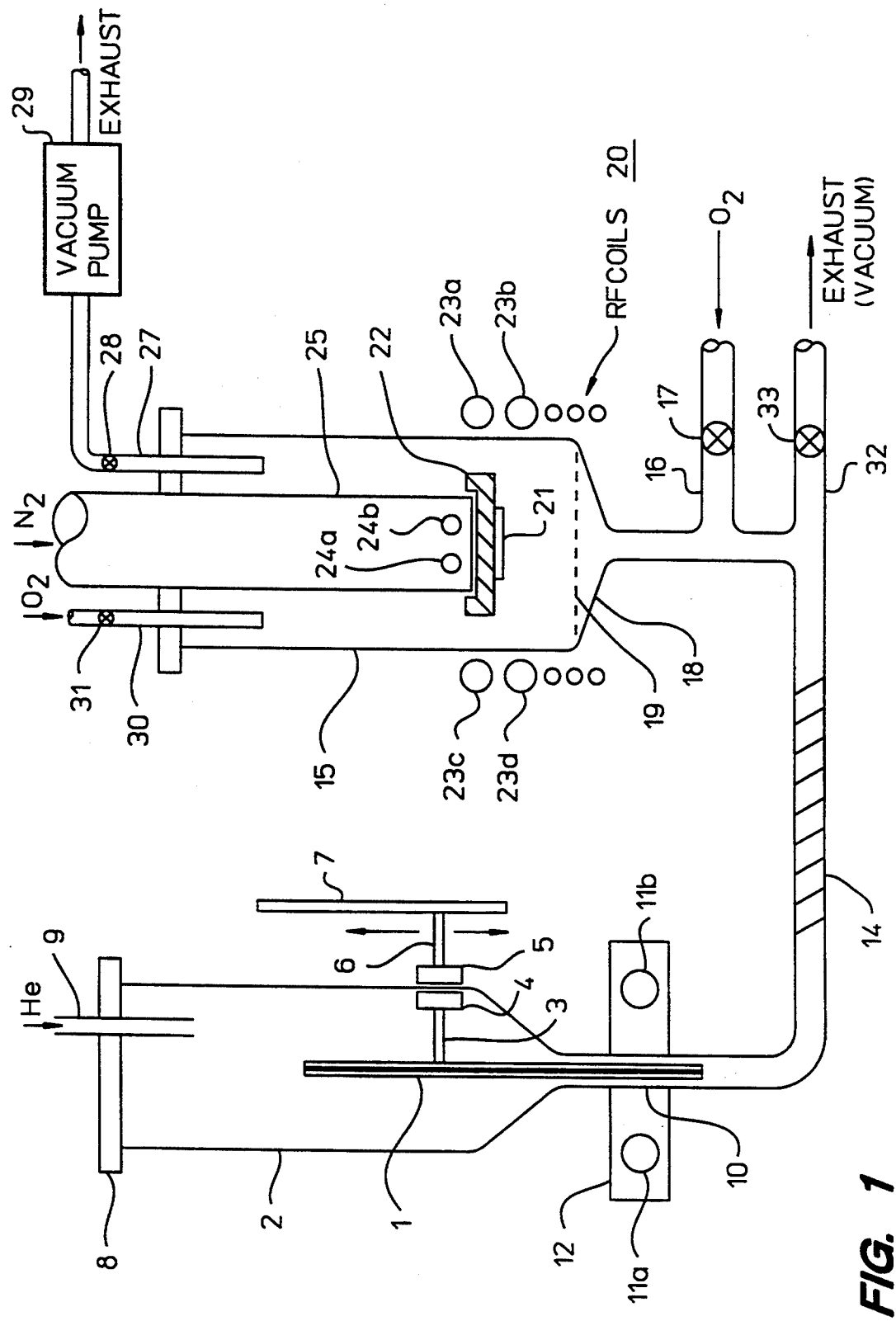
FIG. 1 is a schematic diagram of the MOCVD apparatus of the invention, viewed in the horizontal direction.

Referring now to FIG. 1, the MOCVD reactor apparatus includes a powder feed tube 1 in a vertical position inside one arm 2 of a substantially U-shaped quartz reactor vessel. The feed tube 1 is movably supported, such that it can be moved vertically at a controlled rate. The mechanism for this control shown in FIG. 1 is a support member 3 attached to the feed tube 1 and extending outward to a magnet 4 at the inner surface of the vessel wall. A second magnet 5 on the opposite side of the wall holds the first magnet 4 slidably in place against the wall. The magnet 5 is supported by the member 6 attached to the drive mechanism 7, and can be moved vertically by this drive mechanism. The mechanism 7 may be a screw drive or any other suitable means for moving the magnet 5 upward and downward. In this way the vertical position and movement of the tube 1 is controlled.

The reactor arm 2 is essentially cylindrical, and the upper end is sealed by a standard vacuum flange. A fill tube 9 passes through this seal to allow helium carrier gas to be introduced into this arm of the vessel. The lower portion of the arm 2 is tapered down to a narrow heating section 10 into which the feed tube extends. Two quartz halogen lamps 11a, 11b are located outside and near the walls of the heating section 10, and a reflective aluminum enclosure 12 extends around these lamps and this heating section. This structure together with the cooling effect of the helium carrier gas flowing downward creates a sharp temperature gradient in the portion of the feed tube 1 entering the heating section 10 as the tube moves downward.

Figure 2:
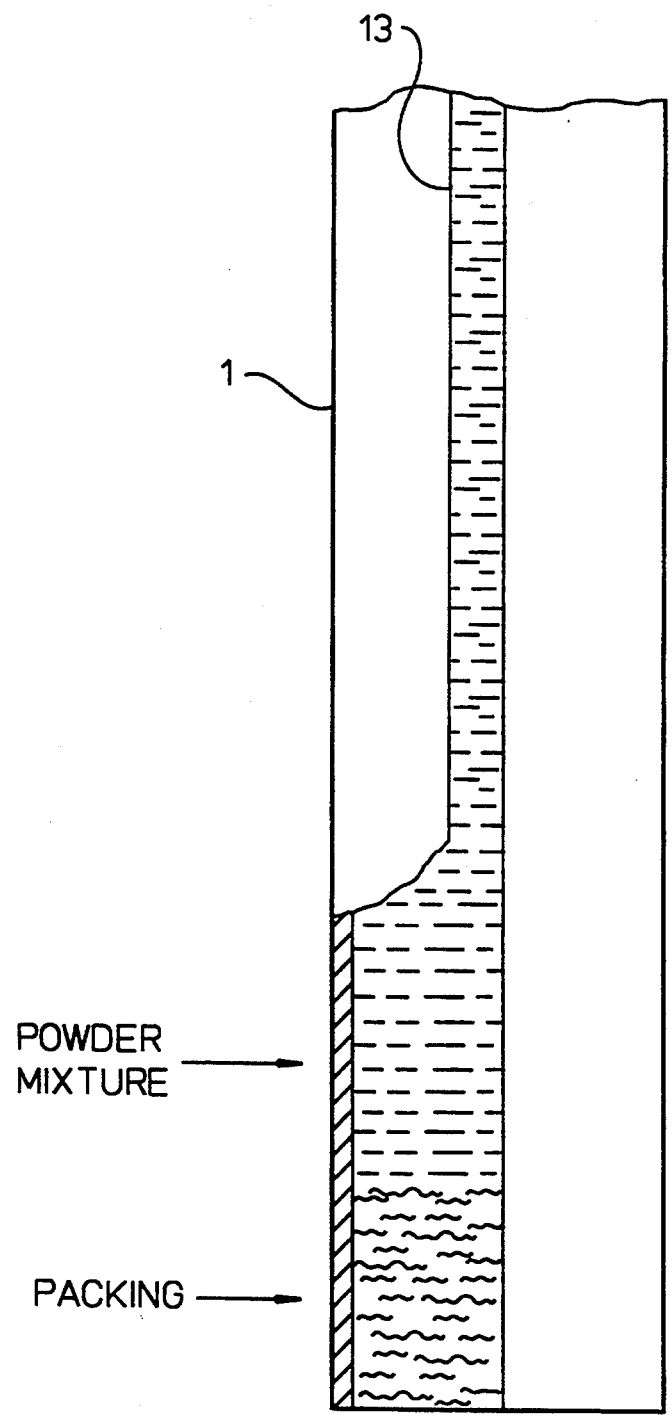
FIG. 2 is an enlarged horizontal view of the lower end of the precursor feed tube, with a portion of the tube partially cut away to show the precursor powder mixture packed inside the tube.

Referring to FIG. 2, the feed tube 1 is typically a pyrex tube having a narrow slot 13 along its entire length. The lower end is packed with glass wool to support the contents of the tube, and the remaining interior contains the precursor powder mixture having the proper composition to yield the desired stoichiometry of the deposited film. For the case of Y-Ba-Cu-O films the precursor powders may be the TMHD chelates of yttrium, barium and copper. The powders are thoroughly mixed, dried, and packed into the tube 1, filling the region above the glass wool packing.

Referring again to FIG. 1, as the feed tube 1 moves downward, the portion of the powder mixture entering the heating section 10 is rapidly vaporized. The vapor escapes from the tube through the slot and is carried through the reactor vessel by the helium carrier gas. Typically the tube may have an inside diameter of 4 mm, and a length of 25 cm, and the slot is approximately 0.5 mm in width. The vertical tube velocity is substantially in the range of 0.05–2 mm per minute. The helium flow rate may be 300 cm$^3$/min, and the lamps 11a, 11b may each be 500 watts in power. With this configuration the precursor powders are heated to temperatures of 400°–500° C. and the temperature gradient can exceed 100° C./cm. The rate of vaporization is controlled by the vertical tube velocity. This structure results in vaporization of nearly all of the precursor powder material except for a small amount of black tarry residue which is believed to be a nonvolatile decomposition product of the barium precursor. This residue flows downward and is trapped by the glass wool packing. In any event the amount of this residue is very small.

The volatilized precursor mixture is swept by the carrier gas down through the bottom of the U-shaped vessel and upward into the opposite arm of 15 of the "U". The lower portion of the vessel may be wrapped with heating tape 14 to keep the quartz walls at a uniform temperature of 275°–350° C., to prevent condensation of the metalorganic material on the walls. In the heating region 10 this may be accomplished by including jet nozzles blowing nitrogen against the exterior wall surface for cooling purposes; these nozzles are not shown in the drawing.

Still referring to FIG. 1, oxygen is introduced into the vapor mixture through the intake tube 16 and valve 17 at a flow rate which may vary from 100–1000 cm$^3$/min. The gases flow upward through an outwardly tapered section 18 and a stainless steel screen 19 to enhance further mixing and laminar flow. Additionally, the apparatus may include coils 20 around the arm, connected to a 13.54 MHz generator, to produce an rf plasma and enhance the chemical reactions as the gas mixture arrives at the reaction zone.

The substrate 21 is attached with thermally conductive paste to the bottom of a metal block 22 inside the enlarged portion of the arm 15 of the vessel. This block and substrate are heated by a bank of four quartz halogen lamps 23$a$, 23$b$, 23$c$, 23$d$ outside the walls of the vessel, and by two more of said lamps 24$a$, 24$b$ immediately above the block 22. The interior lamps 24$a$, 24$b$ are located inside a quartz-walled cylindrical canister 25 extending downward inside the vessel chamber arm 15 to the top of the block 22, and the bases of these interior lamps are cooled by a nitrogen stream circulating the interior of the canister. The quartz walls adjacent to the exterior lamps 23$a$–23$d$ are cooled by nozzles blowing nitrogen streams against these walls, not shown in the drawings. Thus the quartz vessel walls are maintained at temperatures in the range 275°–350° C. The block 22 and substrate 21 are typically maintained at a temperature of 800° C., which is measured by a thermocouple in the block, not shown in the drawing.

By keeping the vessel wall cool in the region near the substrate, particulates formed by gas phase nucleation are directed away from the hot substrate by thermophoresis. The wall temperature in this region is to some extent self-regulating; if the walls become cooler the metalorganic vapor will condense on the walls, absorb heat from the lamps, raise the wall temperature and revaporize. Thus there is substantially no loss of reagent material due to wall condensation.

The upper end of the vessel arm 15 is sealed with a vacuum flange 26, through which the cylinder 25 and exhaust tube 27 extend. The exhaust tube 27 leads through valve 28 to a vacuum pump 29, which maintains the interior of the reactor vessel at a pressure of approximately 4 Torr. This pressure is regulated by a manometer, not shown in the drawing. In addition, fill tube 30 extends through the seal 26 and valve 31 to an oxygen supply. A second exhaust tube 32 leads from the bottom of the U-shaped portion of the reactor vessel through a valve 33 to a bypass vacuum line.

The process is initiated by turning on all the heating lamps, closing valves 17 and 28, and opening valves 31 and 33. This causes oxygen to flow downward through the right-hand arm of the vessel and sweep gases out through the auxiliary exhaust line 32. When the system has reached thermal equilibrium valves 31 and 33 are closed, and the valves 17 and 28 are opened. The gas mixture is then carried into the substrate reaction zone and film growth commences.

When the film growth is completed, lamps 11$a$ and 11$b$ are turned off, which stops the vaporization process. Valves 31 and 33 are opened and valve 28 is closed. This causes oxygen to purge the right-hand arm of the vessel of any remaining reagent gases. Then valve 33 is closed and valves 17 and 31 are opened to their maximum flow rates to bring the reaction vessel up to atmospheric pressure. Finally the remaining lamps are turned off and the substrate is allowed to cool.

Figure 3:
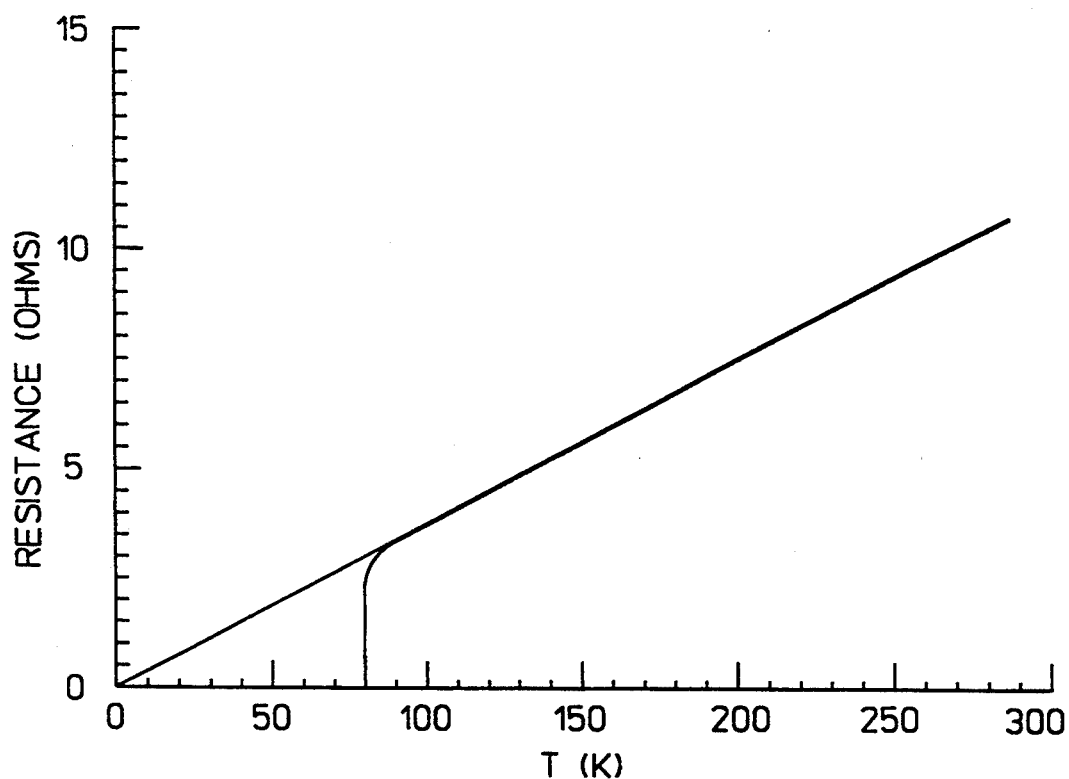
FIG. 3 is a graph of resistance plotted against temperature for a film of Y-Ba-Cu-O fabricated according to the present technique.
Figure 4:
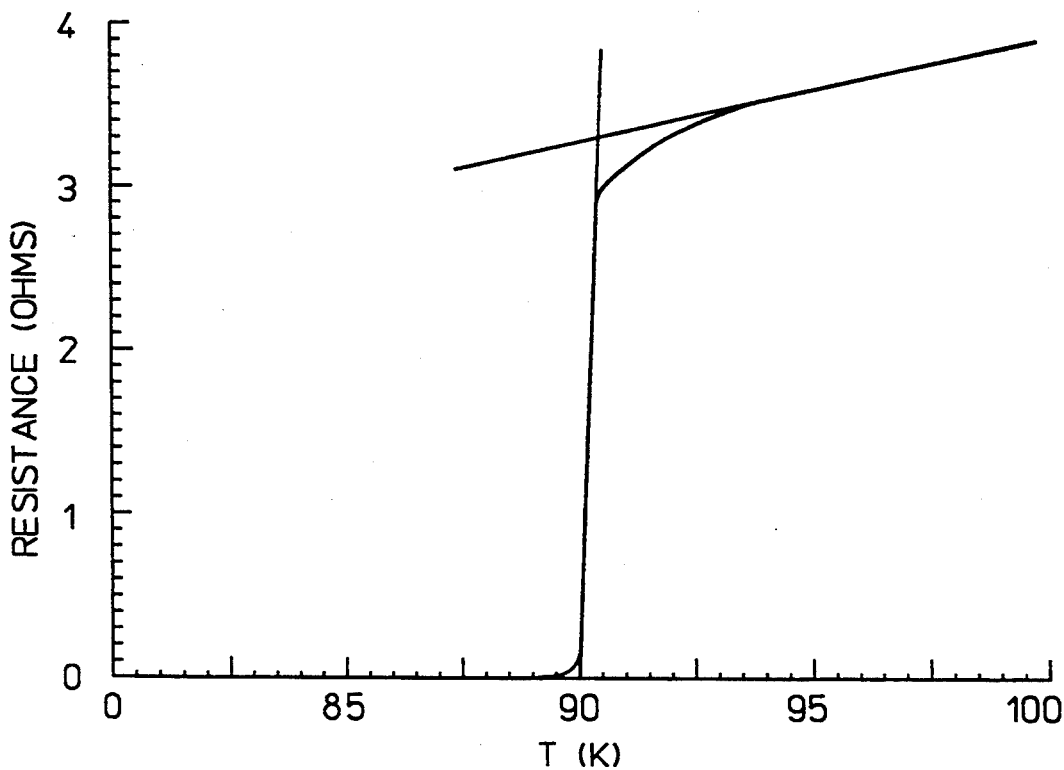
FIG. 4 shows an enlarged portion of the graph of FIG. 3 in the region of the transition temperature, illustrating the sharpness of the superconducting transition for the film.
Figure 5:
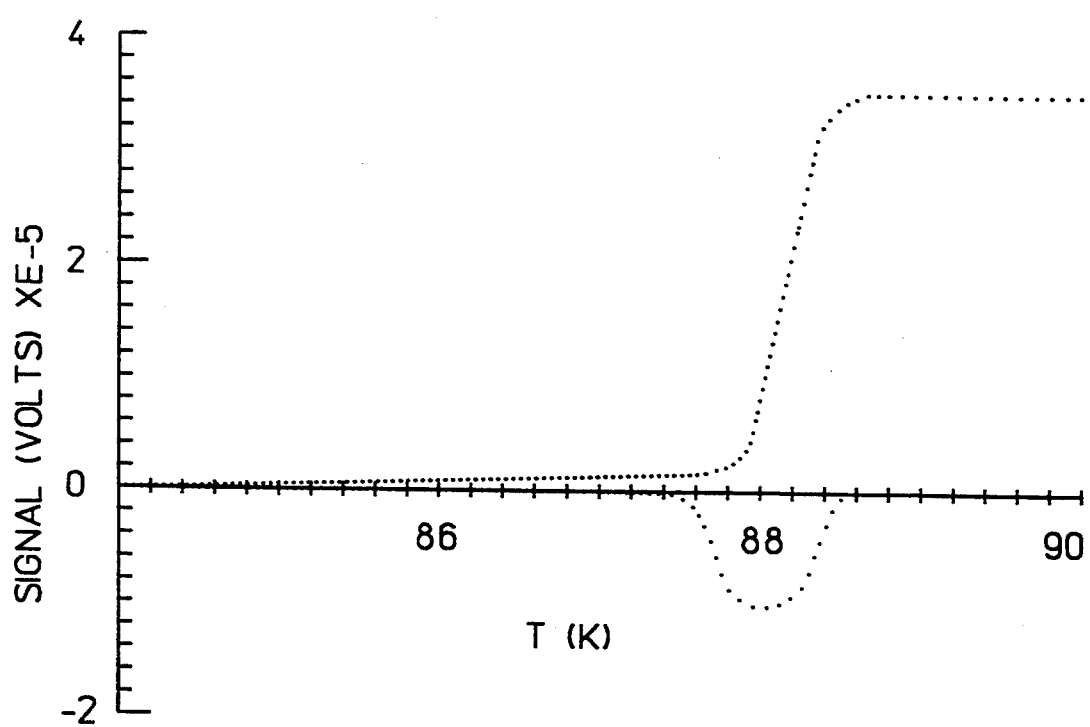
FIG. 5 is a plot of the ac susceptibility as a function of temperature in the region of the transition temperature for the Y-Ba-Cu-O film of FIG. 3. The points above the temperature axis are the real part, and the points below the axis are the imaginary part of the susceptibility.

The foregoing technique has been used to grow Y-Ba-Cu-O films having thicknesses of 3000–5000 Angstroms in periods of 13–360 minutes. The room temperature resistivity is typically less than 1 milliohm-cm, and superconducting transition temperatures above 89° K. have been achieved. FIGS. 3 and 4 show the resistance of a typical sample film as a function of temperature, and the sharpness of the transition and direct proportionality of R-T above the transition temperature indicate the high quality of the film. This sample is a film of Y-Ba-Cu-O grown on a LaAlO$_3$ substrate. The ac susceptibility data for this sample, shown in FIG. 5, indicates complete Meissner shielding within one degree Kelvin after the resistance drops to zero. The microwave surface resistance is less than 40 micro-ohms at 10 GHz and 4.2° K. X-ray diffraction data indicate that the film growth is along the c-axis with a lattice parameter of 11.67 Angstroms, which is the equilibrium bulk lattice value. Therefore this technique results in films with the proper amount of oxygen incorporated into the lattice.

Using rf coils to generate a plasma in the reacting gases has a profound effect in improving the quality of the films. Both the oxygenation and the organometallic reactions are enhanced during film growth. This allows the process to proceed at lower temperatures, since energy is supplied by the rf field.

This technique has also been found useful with a variety of substrates and other films. It is important that the same ligands be used for all components of a given film to avoid ligand exchange rendering some of the components nonvolatile.

The solid precursor powders can be mixed with nonvolatile solid powder dispersant in the feed tube typically as a 1–10% solution. This dispersant is itself preferably a mixture of nonvolatile compounds, such as carbonates or oxides, of the same metals or rare-earth elements as those in the precursors. For example in the case of Y-Ba-Cu-O films, the dispersant may be advantageously a mixture of $BaCO_3$, $Y_2O_3$, and $CuO$. This enhances any chemical reaction equilibrium point toward the volatile species and away from the decomposition products.

The foregoing description is directed toward the growth of a single film of a given stoichiometric composition. Multilayer heterostructure films may also be grown with this apparatus by filling the feed tube with different mixtures of different precursor compositions in different sections along the tube, with each section having a uniform mixture of given precursor composition. As each section passes through the heating zone the corresponding film layer is grown. The interface between layers can be made sharp by including a region containing inert material, such as glass wool packing, or no material at all, in the feed tube between the sections of different precursor compositions. Alternatively the layer structure can be made to vary smoothly across the interface by shortening the inert material region, as well as by increasing the speed of the feed tube or decreasing the temperature gradient at the edge of the heating zone. It will be appreciated that with the present method a great variety of multilayer heterostructure films can be grown.

It is clear that this technique solves the decomposition problem, particularly with respect to the barium precursor. The key feature is that the feed tube moves vertically downward into the heating zone. If the feed tube travel were upward instead, the nonvolatile barium residue would flow downward into the unvaporized reagent powder and corrupt the vaporization process by promoting interaction and incomplete vaporization.

The same problem arises if the tube is delivered horizontally into the heating zone. The nonvolatile barium residue tends to flow backward into the fresh powder mixture. A possible variation on the technique is to move the tube downward at an angle relative to the vertical direction.

The foregoing description of the preferred embodiment of the invention has been presented for purposes of illustration and description, and it is not intended to be exhaustive or to limit the invention to the precise form disclosed. Obviously many modifications and variations are possible in light of the above teaching. It is intended that the spirit and scope of the invention are to be defined by reference to the claims appended hereto.

What is claimed is:

1. Apparatus for metalorganic chemical vapor deposition of thin films, comprising:
    (a) an elongated feed member containing a uniform mixture of precursor materials distributed along the length of said member, said mixture having a composition such that said films have the desired stoichiometric ratios of elements, said mixture being contained such that upon heating a localized section of said member above the vaporization temperatures of said precursor materials the vaporized precursor materials can escape from said feed member in a direction perpendicular to the longitudinal axis of said member;
    (b) heating means for raising the temperature of a localized section of said elongated feed member above the vaporization temperatures of said precursor materials, and for vaporizing substantially all of said precursor materials in said section, such that at the boundary between said localized section and the unvaporized precursor materials outside of said section the temperature gradient has a large magnitude along the longitudinal direction;
    (c) drive means for continuously varying the localized section of said elongated feed member that is heated by said heating means;
    (d) transport means for transporting said vaporized precursor materials from said elongated feed member to a reaction zone where said vaporized precursor materials undergo the desired chemical reaction; and
    (e) a substrate located in said reaction zone such that the products of said chemical reaction are deposited on said substrate and form said thin film.

2. Apparatus according to claim 1, wherein said elongated feed member comprises a tube having a longitudinal slot through the tube wall parallel to the axis of the tube, and wherein said mixture of precursor materials is contained inside said tube.

3. Apparatus according to claim 1, wherein said elongated feed member is oriented such that nonvolatile decomposition products formed in said localized section by the heating of precursor materials in said section flow away from said unvaporized precursor materials outside of said section.

4. Apparatus according to claim 3, wherein said elongated feed member comprises a tube having a longitudinal slot through the tube wall parallel to the axis of the tube, and wherein said mixture of precursor materials is contained inside said tube.

5. Apparatus according to claim 4, wherein said tube is oriented such that one end of said tube is substantially lower than the opposite end of said tube, and wherein the location of the localized section of said tube whose temperature is raised by said heating means is varied continuously by said drive means along said tube in the direction of increasing elevation.

6. Apparatus according to claim 5, wherein said tube is oriented with its axis in the vertical direction.

7. Apparatus according to claim 5, wherein said heating means comprises fixed heating means for heating the material in a fixed region of space such that said tube extends downwardly into said fixed region, and wherein said drive means comprises
    (a) a support member rigidly attached to said tube; and
    (b) a drive mechanism connected to said support member such that said drive mechanism moves said support member continuously along a path parallel to the longitudinal axis of said tube in the direction of decreasing elevation.

8. Apparatus according to claim 7, wherein said tube is oriented with its axis in the vertical direction.

9. Apparatus according to claim 7, wherein said fixed heating means comprises
    (a) a heat radiator in spatial proximity with the localized section of said tube extending into said fixed region of space; and
    (b) a heat reflector surrounding said fixed region of space and having openings at the locations where said tube intersects the boundaries of said fixed regions such that said tube extends through said openings into said fixed region of space.

10. Apparatus according to claim 1, wherein said transport means comprises
    (a) a carrier gas; and
    (b) means for propelling said carrier gas, such that said carrier gas passes by said elongated feed member, entrains said vaporized precursor materials, and transports said precursor materials into said reaction zone.

11. Apparatus according to claim 10, further comprising oxygenation means for introducing oxygen into said carrier gas at a controlled rate prior to said carrier gas entering into said reaction zone.

12. Apparatus according to claim 1, further comprising means for heating said substrate.

13. Apparatus according to claim 1, further comprising means for producing a plasma in said vaporized precursor materials in said reaction zone.

14. Apparatus according to claim 11, further comprising means for producing a plasma in said carrier gas into which oxygen and vaporized precursor materials have been introduced in said reaction zone.

15. Apparatus for metalorganic chemical vapor deposition of thin films, comprising:
    (a) an elongated feed member containing a plurality of precursor mixtures distributed along the length of said member, such that each of said precursor mixtures is a uniform mixture of precursor materials having a composition such that the resulting film layer formed from said precursor mixture has the desired stoichiometric ratio of elements, wherein each of said precursor mixtures is contained in a corresponding precursor section along the length of said member, and such that upon heating a localized portion of said precursor section above the vaporization temperatures of the precursor materials in said section, the vaporized precursor materials in said section, the vaporized precursor materials can escape from said feed member in a direction perpendicular to the longitudinal axis of said member;

(b) heating means for raising the temperature of any localized portion of any precursor section above the vaporization temperatures of said precursor materials, and for vaporizing substantially all of said precursor materials in said portion, such that at the boundary between said localized portion and unvaporized precursor materials outside of said portion the temperature gradient has a large magnitude along the longitudinal direction;

(c) drive means for continuously varying the localized portion of said elongated feed member that is heated by said heating means;

(d) transport means for transporting said vaporized precursor materials from said elongated feed member to a reaction zone where said vaporized precursor materials undergo the desired chemical reaction; and (e) a substrate located in said reaction zone such that the products of said chemical reaction are deposited on said substrate and form said thin film.

16. Apparatus according to claim 15, wherein said precursor sections are disposed along the length of said feed member such that each pair of adjacent precursor sections is separated by a spacer section, and further wherein each spacer section does not contain any material that can affect the chemical vapor deposition of the precursor materials.

17. Apparatus according to claim 15, wherein said elongated feed member comprises a tube having a longitudinal slot through the tube wall parallel to the axis of the tube, and wherein said mixtures of precursor materials are contained inside said tube.

18. Apparatus according to claim 15, wherein said elongated feed member is oriented such that nonvolatile decomposition products formed in said localized section by the heating of precursor materials in said section flow away from said unvaporized precursor materials outside of said section.

19. Apparatus according to claim 18, wherein said elongated feed member comprises a tube having a longitudinal slot through the tube wall parallel to the axis of the tube, and wherein said mixtures of precursor materials are contained inside said tube.

20. Apparatus according to claim 19, wherein said tube is oriented such that one end of said tube is substantially lower than the opposite end of said tube, and wherein the location of the localized portion of said tube whose temperature is raised by heating means is varied continuously by said drive means along said tube in the direction of increasing elevation.

21. Apparatus according to claim 20, wherein said tube is oriented with its axis in the vertical direction.

22. Apparatus according to claim 20, wherein said heating means comprises fixed heating means for heating the material in a fixed region of space such that said tube extends downwardly into said fixed region, and wherein said drive means comprises (a) a support member rigidly attached to said tube; and (b) a drive mechanism connected to said support member such that said drive mechanism moves said support member continuously along a path parallel to the longitudinal axis of said tube in the direction of decreasing elevation.

23. Apparatus according claim 22, wherein said tube is oriented with its axis in the vertical direction.

24. Apparatus according to claim 22, wherein said fixed heating means comprises (a) a heat radiator in spatial proximity with the localized section of said tube extending into said fixed region of space; and (b) a heat reflector surrounding said fixed region of space and having openings at the locations where said tube intersects the boundaries of said fixed regions such that said tube extends through said openings into said fixed region of space.

25. Apparatus according to claim 15, wherein said transport means comprises (a) a carrier gas; and (b) means for propelling said carrier gas, such that said carrier gas passes by said elongated feed member, entrains said vaporized precursor materials, and transports said precursor materials into said reaction zone.

26. Apparatus according to claim 25, further comprising oxygenation means for introducing oxygen into said carrier gas at a controlled rate prior to said carrier gas entering into said reaction zone.

27. Apparatus according to claim 15, further comprising means for heating said substrate.

28. Apparatus according to claim 15, further comprising means for producing a plasma in said vaporized precursor materials in said reaction zone.

29. Apparatus according to claim 26, further comprising means for producing a plasma in said carrier gas into which oxygen and vaporized precursor materials have been introduced in said reaction zone.

* * * * *